United States Patent [19]

Ito

[11] Patent Number: 4,988,944
[45] Date of Patent: Jan. 29, 1991

[54] CROSS COIL TYPE INSTRUMENT

[75] Inventor: Akio Ito, Konosu, Japan

[73] Assignee: Jeco Company Limited, Japan

[21] Appl. No.: 388,588

[22] Filed: Aug. 2, 1989

[30] Foreign Application Priority Data

Aug. 12, 1988 [JP] Japan .................................. 63-200061
Sep. 14, 1988 [JP] Japan .................................. 63-120679
Sep. 28, 1988 [JP] Japan .................................. 63-242948

[51] Int. Cl.⁵ .............................................. G01P 1/00
[52] U.S. Cl. ............................ 324/154 PB; 324/143;
324/151 A; 324/152; 324/167
[58] Field of Search ............ 324/154 PB, 140 R, 143,
324/146, 151 R, 151 A, 152, 154 R, 167, 132

[56] References Cited

U.S. PATENT DOCUMENTS

| | | | |
|---|---|---|---|
| 2,668,745 | 2/1954 | Pfeffer | 324/152 |
| 2,778,989 | 1/1957 | Miller | 324/144 |
| 3,602,811 | 8/1971 | Fales | 324/132 X |
| 3,995,214 | 11/1976 | Dionne | 324/151 A X |
| 4,553,093 | 11/1985 | Chikasue | 324/154 R X |
| 4,758,784 | 7/1988 | Baker et al. | 324/146 |

FOREIGN PATENT DOCUMENTS

43364 3/1984 Japan .
104383 7/1986 Japan .
273457 11/1987 Japan .

Primary Examiner—Reinhard J. Eisenzopf
Assistant Examiner—Robert W. Mueller
Attorney, Agent, or Firm—Andrus, Sceales, Starke & Sawall

[57] ABSTRACT

A cross coil type instrument includes a plurality of coils cross-arranged around a movable permanent magnet, a needle fastened to the movable permanent magnet through a shaft projecting from the movable permanent magnet and penetrating the coils, a reset-to-zero permanent magnet arranged in the vicinity of the movable permanent magnet, and a stopper so as to make contact with the needle at a reference indication position when the movable permanent magnet is driven only by the reset-to-zero permanent magnet. Further the instrument has a circuit which receives an input signal related to a quantity to be measured and generates drive signals to be supplied to the respective coils based on the input signal so that a composite magnetic field formed by the coils presents a first error in deflection angle of the movable permanent magnet, and an error obtained by adding the first error in deflection angle and a second error in deflection angle due to the reset-to-zero permanent magnet changes linearly as a function of an electrical angle of the drive signals.

13 Claims, 10 Drawing Sheets

| n | x [n] | y [n] | y [n-1] |
|---|---|---|---|
| -1 | 0 | 0 | 0 |
| 0 | 1 | 1 | 0 |
| 1 | 1 | 1.5 | 1 |
| 2 | 1 | 1.75 | 1.5 |
| 3 | 1 | 1.875 | 1.75 |
| 4 | 1 | 1.9375 | 1.875 |
| ⋮ | ⋮ | ⋮ | ⋮ |
|  | 1 | 2 | 2 |

| STATE | RESET-TO-ZERO SIG | COMP RESULT | fs |
|---|---|---|---|
| RESET-TO-ZERO | H | X | 50Hz |
| HIGH REVOLUTION | L | H | 25Hz |
| LOW REVOLUTION | L | L | 12.5Hz |

CROSS COIL TYPE INSTRUMENT

BACKGROUND OF THE INVENTION

The present invention generally relates to a cross coil type instrument, and particularly to a cross coil type instrument which can be applied to a revolution indicator indicating a revolution of an engine for an automobile, a speed meter, and so on.

A cross coil type instrument includes a movable permanent magnet around which a plurality of coils are cross-arranged. Currents based on an quantity to be measured pass through the coils, which generate a composite magnetic field. The movable permanent magnet having a needle is rotated due to the generated composite magnetic field.

A conventional cross coil type instrument is described with reference to FIG. 1. A movable permanent magnet 31 is fixed to a needle shaft 32. A needle 33 is fastened to an end of the needle shaft 32. Two coils 34 and 35 are cross-arranged at an angle of 90 degrees. A cosX drive circuit 36 supplies the coil 34 with a cosX drive signal I as shown in FIG. 2 where "X" is an electrical angle. A sinX drive circuit 37 supplies the coil 35 with a sinX derive signal II as shown in FIG. 2. The levels of the drive signals I and II change based on a quantity to be measured.

When power supply to the drive circuits 36 and 37 is turned OFF, the movable permanent magnet 31 rests so that the needle 33 is fixed to a position indicated at that time. For example, in the case where a cross coil type instrument is applied to an indicating instrument for indicating engine revolution, when an ignition switch is turned OFF, a needle of the indicating instrument is held at a position indicated just prior to turning the ignition switch OFF. For this reason, the cross coil type instrument requires a reset-to-zero mechanism which returns the needle (movable permanent magnet) to a zero position when power is turned OFF.

Conventionally, the reset-to-zero mechanism is formed by a permanent magnet (reset-to-zero permanent magnet), which is positioned in the vicinity of the movable permanent magnet. The reset-to-zero permanent magnet functions to absorb the movable permanent magnet. It is noted that force due to the reset-to-zero permanent magnet is always exerted on the movable permanent magnet 31 during normal operation. Thus, the rotation (or deflection) angle of the needle is not proportional to a change in quantity to be measured. In other words, the needle rotates non-linearly in response to a change in quantity to be measured. In addition, it is impossible to arrange indication scales at equal intervals.

SUMMARY OF THE INVENTION

It is an object of the present invention to provide an improved cross coil type instrument in which the above-mentioned disadvantages are eliminated.

A more specific object of the present invention is to provide a cross coil type instrument capable of linearly indicating a quantity to be measured.

The above objects of the present invention can be achieved by a cross coil type instrument includes a plurality of coils cross-arranged around a movable permanent magnet, a needle fastened to the movable permanent magnet through a shaft projecting from the movable permanent magnet and penetrating the coils, a reset-to-zero permanent magnet arranged in the vicinity of the movable permanent magnet, and a stopper so as to make contact with the needle at a reference indication position when the movable permanent magnet is driven only by the reset-to-zero permanent magnet. Further the instrument has a circuit which receives an input signal related to a quantity to be measured and generates drive signals to be supplied to the respective coils based on the input signal so that a composite magnetic field formed by the coils presents a first error in deflection angle of the movable permanent magnet, and an error obtained by adding the first error in deflection angle and a second error in deflection angle due to the reset-to-zero permanent magnet changes linearly as a function of an electrical angle of the drive signals.

Additional objects, features and advantages of the present invention will become apparent from the following detailed description when read in conjunction with the accompanying drawings.

DESCRIPTION OF THE PREFERRED EMBODIMENTS

A description is given of a preferred embodiment of the present invention.

Figure 1:
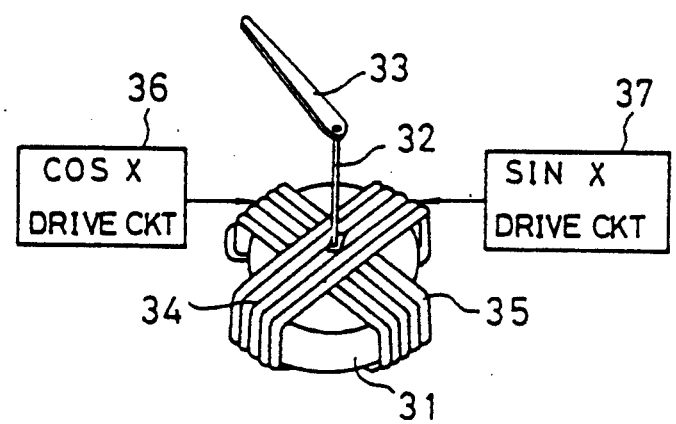
FIG. 1 is a perspective view of a conventional cross coil type instrument.
Figure 2:
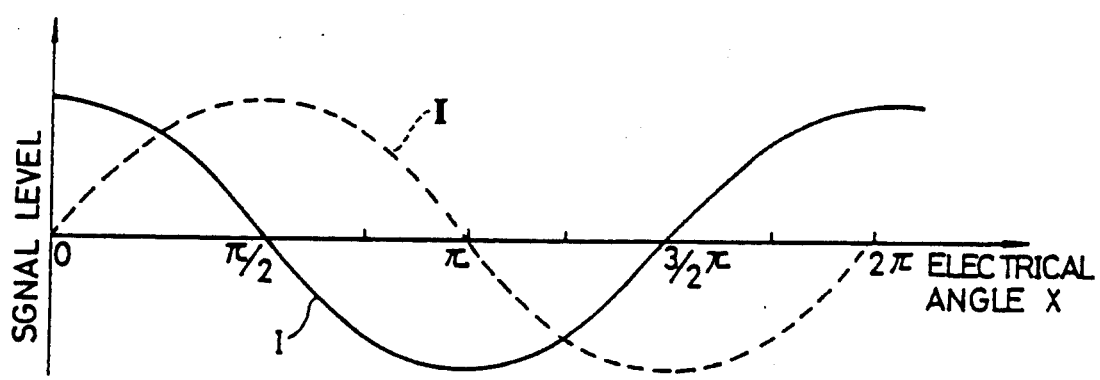
FIG. 2 is a waveform diagram of signals supplied to cross coils shown in FIG. 1.
Figure 3:
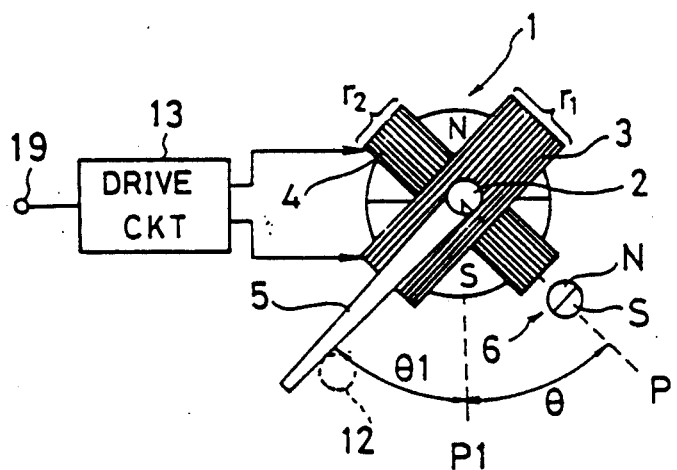
FIG. 3 is a plan view of a preferred embodiment of the present invention where a scale plate is omitted.

Referring to FIG. 3, a movable permanent magnet 1 of a disc shape is fixed to a needle shaft 2. Coils 3 and 4 are cross-arranged at an angle of 90 degrees so as to surround the movable permanent magnet 1. The needle shaft 2 is fastened to the movable permanent magnet 1 and is supported at a position where the coils 3 and 4 intersect. The movable permanent magnet 1 is rotatably supported in the coils 3 and 4. An end of the needle shaft 2 is provided with a needle 5, which rotates along with rotation of the movable permanent magnet 1. The movable permanent magnet 1 has a pair of S and N poles shown in FIG. 3. A reset-to-zero magnet 6 is provided in the vicinity of the movable permanent magnet 1. The reset-to-zero permanent magnet 6 has an N pole which faces the movable permanent magnet 1 and an S pole opposite to the N pole. The reset-to-zero permanent magnet 6 functions to return the needle 5 at a reset-to-zero position P where the N and S poles of the movable permanent magnet 1 and the N and S poles of the reset-to-zero permanent magnet 6 are arranged into a line.

A scale plate 11 is provided between the movable permanent magnet 1 and the needle 5. Indication scales printed on the scale plate 11 and are arranged at equal intervals. A stopper 12 formed by a pin is provided on the scale plate 11 so as to project therefrom. The stopper 12 stops the needle 5 at a position P1 where the movable permanent magnet 1 precedes the reset-to-zero position P by a deflection angle $\theta$. At this time, the needle 5 precedes the position P1 by an angle $\theta 1$ (45 degrees for example). In other words, the position P1 serves as a new reset-to-zero position of the movable permanent magnet 1 in place of the position P. The stopper 12 is one of the essential features of the present invention, and will be described in detail later.

A drive circuit 13 supplies the coil 3 with a sine-wave drive signal, the level (amplitude) of which changes in response to the level (amplitude) of an input signal applied to an input terminal 19 of the drive circuit 13. The drive circuit supplies the coil 4 with a cosine-wave drive signal, the level (amplitude) of which changes in response to the level of the input signal. For example, the input signal is a pulse signal, the frequency of which changes based on a change in quantity such as velocity to be measured.

One of the essential features of the present invention is that the magnitude of magnetic field generated by the coil 4 is slightly smaller than that of magnetic field generated by the coil 3 or vice versa. The magnitudes of the magnetic fields generated by the coils 3 and 4 can be varied by changing the levels of the driving signals derived from the drive circuit 13. Alternatively, the magnitudes of the magnetic fields generated by the coils 3 and 4 can be changed by using different numbers of turns of the coils 3 and 4. A composite magnetic field formed by the coils 3 and 4 presents a first error in deflection angle of the movable permanent magnet 1 (therefore the needle 5), and an error obtained by the first error in deflection angle and a second error in deflection angle due to the reset-to-zero permanent magnet 6 changes linearly as a function of an electrical angle of the drive signals. This will be described in detail below.

Figure 4:
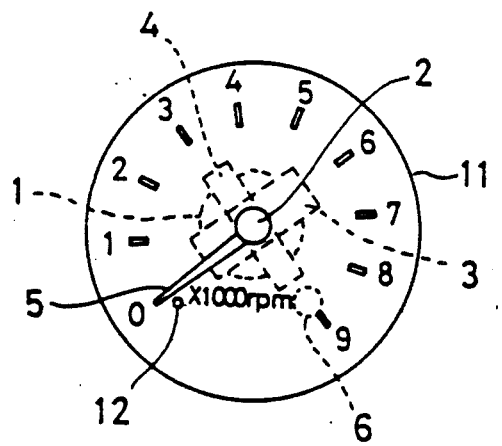
FIG. 4 is a plan view of the preferred embodiment of the present invention.
Figure 5:
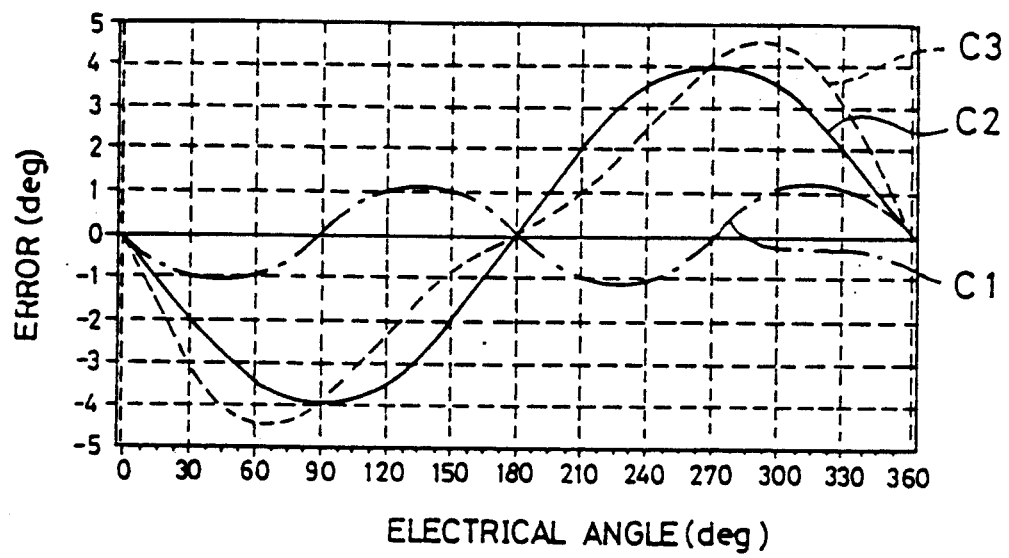
FIG. 5 is a graph of an error v. electrical angle characteristic obtained according to the embodiment.
Figure 6:
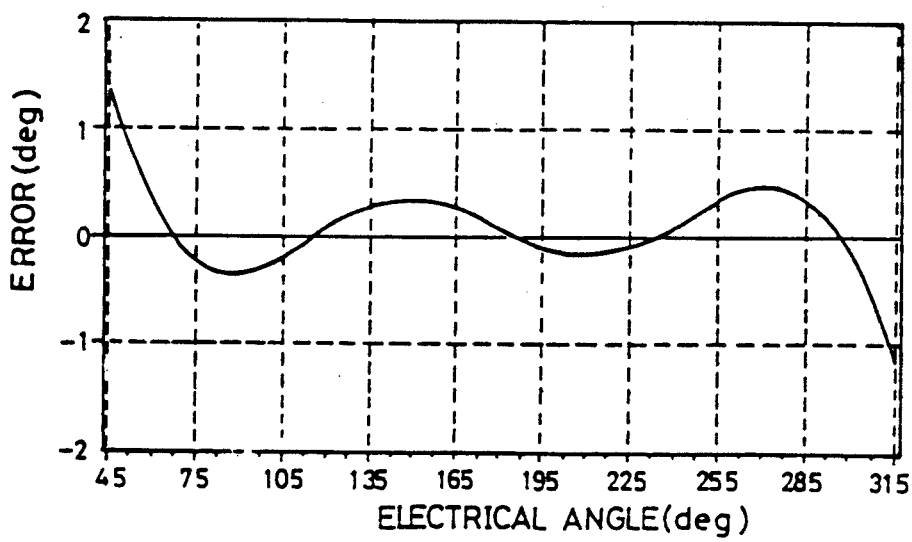
FIG. 6 is a graph of a rewritten error v. electrical angle characteristic obtained according to the present embodiment.

FIG. 5 is a graph of an error (degree) v. electrical angle (degree) characteristic. A curve C1 is an error characteristic due to the composite magnetic field formed by the coils 3 and 4 where the magnitude of the magnetic field formed by the coil 4 is slightly smaller than that of the magnetic field formed by the coil 3 or vice versa. A curve C2 is an error characteristic due to the fact that absorption force due to the reset-to-zero permanent magnet 6 is exerted on the movable permanent magnet 2. A curve C3 is a characteristic of a combined error obtained by adding the curves C1 and C2. The composite error characteristic can be represented as follows:

$$\delta = \arctan(K \cdot \sin(X)/\cos(X)) - X$$

where $\delta$ is an error in deflection angle, and K is the ratio of the magnetic fields formed by the coils 3 and 4. It can be seen from FIG. 5 that the combined error characteristic C3 has a linearity better than the error characteristic C2 due to the reset-to-zero permanent magnet 6 within a range between an electrical angle of about 90 degrees and an electrical angle of about 270 degrees. It can also be seen from a graph of FIG. 6 that the error deflection angle is almost identical to zero over the above-mentioned range. Thus, it is possible to measure a quantity with high precision over the range between 90 degrees and 270 degrees. Generally, precise indication is not required at small deflection angles of needle. From this viewpoint, it is possible to set the actual use range to a range starting from about 45 degrees. Thus, as shown in FIGS. 3 and 4, the stopper 12 enables the reset-to-zero position of the movable permanent magnet 1 to precede the position of the reset-to-zero permanent magnet 6 at angle $\theta$ (45 degrees, for example). As will be described later, it is preferable that the angle $\theta$ be set to an angle of 45 degree $\pm 10$ degrees. The position of the stopper 12 is not limited to the position shown in FIGS. 3 and 4. The important matter is that the stopper 12 is positioned so that when the needle 5 makes contact with the stopper 12, the movable permanent magnet 1 precedes the original reset-to-zero position P by angle $\theta$ (45 degrees for example). Since the error characteristic C3 resulting from the composite magnetic field is linear and the magnetic field by the reset-to-zero permanent magnet 6, it becomes possible to equally arrange indication scales on the scale board 7 as shown in FIG. 4.

Figure 7:
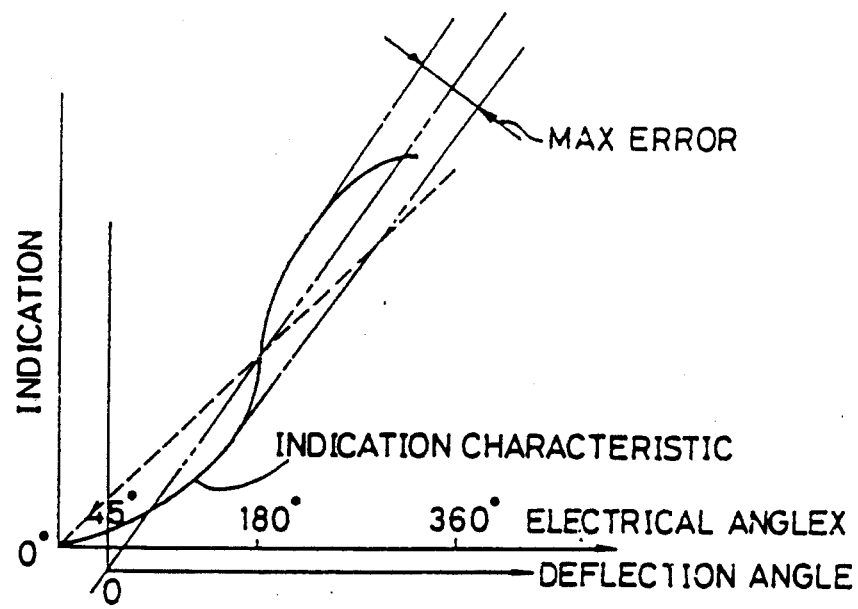
FIG. 7 is a graph of an error characteristic obtained by a variation of the embodiment.
Figure 8:
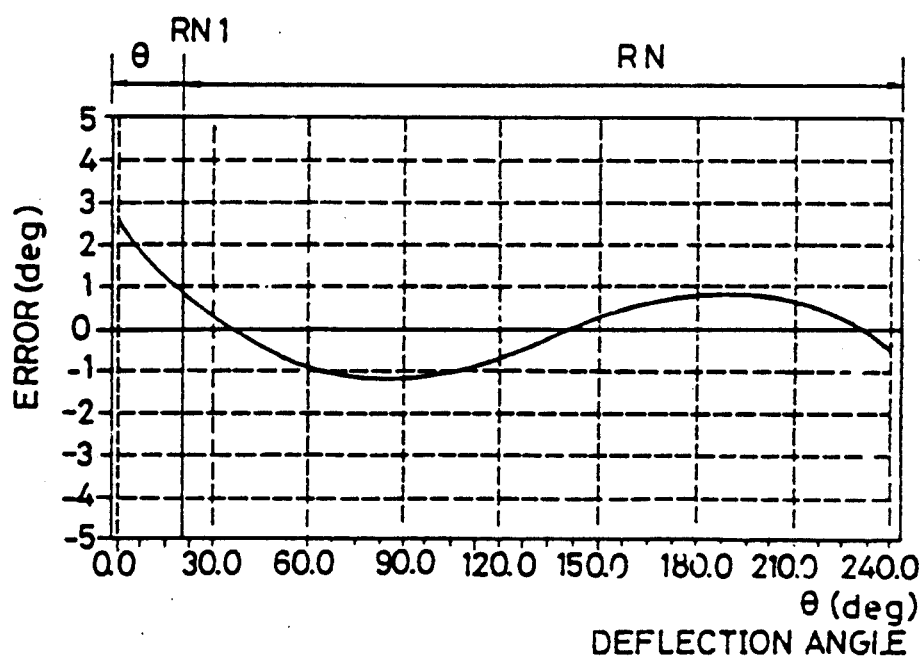
FIG. 8 is a graph of a rewritten error characteristic of the variation of the embodiment.

As described above, the linear error characteristic can be obtained by forming the composite magnetic field formed by the magnetic fields having the mutually different magnitudes. Alternatively, even when the coils 3 and 4 generate magnetic fields of the same magnitude, the aforementioned position of the stopper 12 provides an advantage. For example, the following advantage can be obtained even when there is no difference in magnitude between the magnetic field formed by the coil 3 and the magnetic field formed by the coil 4. FIGS. 7 and 8 are graphs of error characteristics obtained when the magnitude of the magnetic field formed by the coil 3 is identical to that of the magnetic field formed by the coil 4. It can be seen from FIGS. 7 and 8 that a range RN is suitable for the actual use range. Therefore, the stopper 12 is positioned so that the movable permanent magnet 1 is stopped at position RNI which precedes the original reset-to-zero position by an angle $\theta$.

Figure 9:
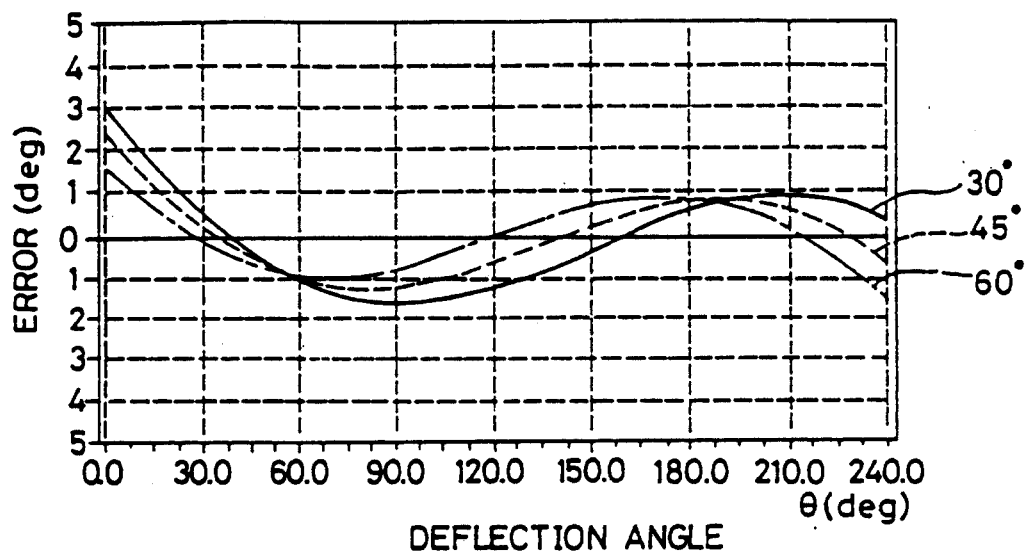
FIG. 9 is a graph of an error v. deflection angle characteristic obtained by the experiments.

As indicated previously, it is preferable that the angle $\theta$ should be set to 45 degrees $\pm 10$ degrees. This is based on the following experimental results. Referring to a graph of FIG. 9, when the angle $\theta$ is set equal to 30 degrees, errors increase at small deflection angles. When the angle $\theta$ is set equal to 60 degrees, errors increases at large deflection angles. In those cases, the possible actual use range is narrow. Therefore, it is preferable to select the range between 35 degrees and 55 degrees.

Figure 10:
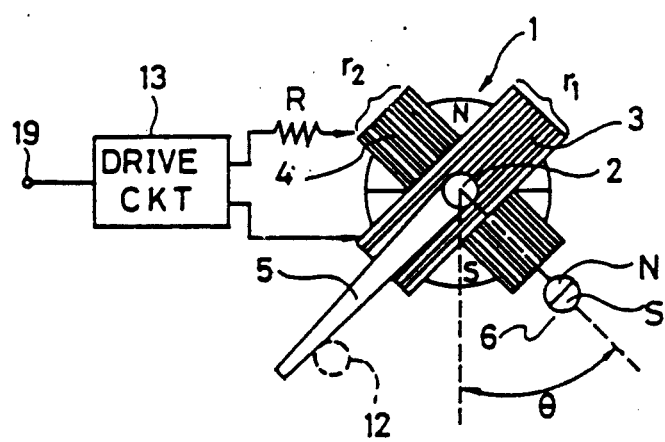
FIG. 10 is a plan view of a second embodiment of the present invention.

In order to obtain the magnetic field formed by the coil 3 having a magnitude greater than that of the magnetic filed formed by the coil 4, the number of turns of the coil 3 is set more than that of the coil 4. Alternatively, when the number of turns of the coil 3 is equal to that of the coil 4, as shown in FIG. 10, a resistor R can be inserted between the drive circuit 13 and the coil 4 in series.

Figure 11:
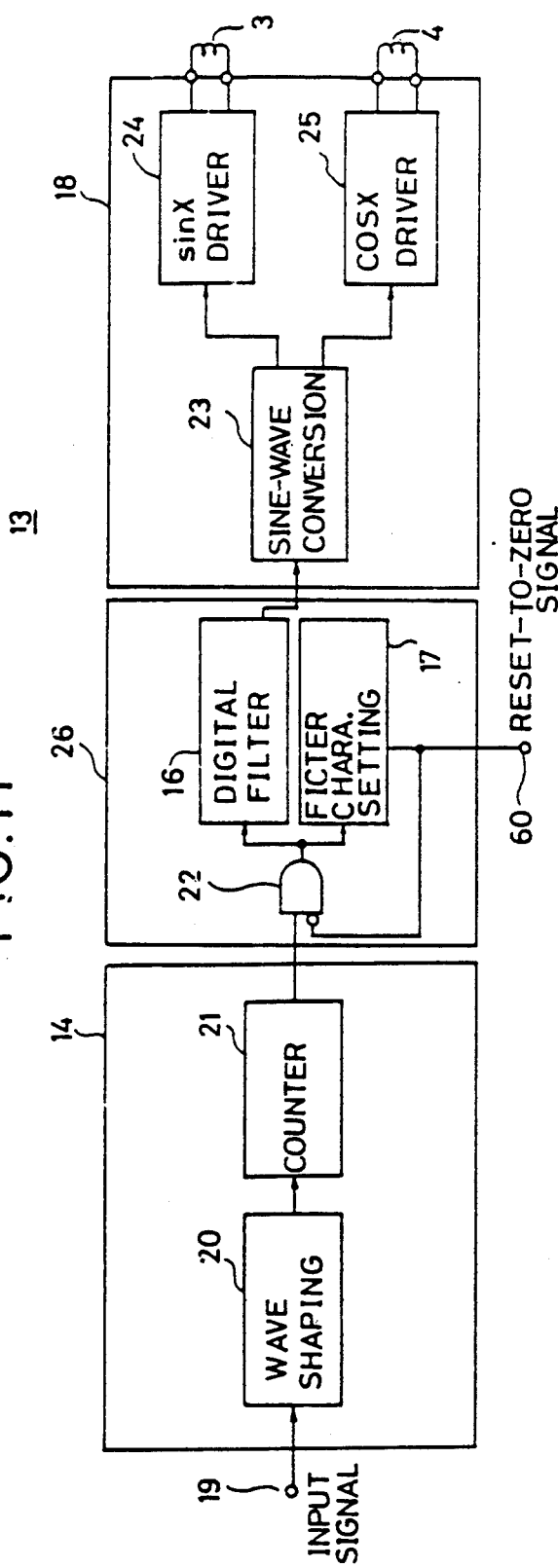
FIG. 11 is a block diagram of a drive circuit shown in FIG. 3.

A description is given of an example of the structure for the drive circuit 13. Referring to FIG. 11, there is illustrated the drive circuit 13, which includes a counter circuit 14, a control circuit 26, and a driver 18. The counter circuit 14 is made up of a waveform shaping circuit 20 and a counter 21. The counter circuit 14 detects the frequency of the input signal applied to the terminal 19, and generates a digital signal based on the detected frequency. The control circuit 26 is made up of an AND gate 22, a digital filter 16, and a filter characteristic setting circuit 17. The output signal of the counter circuit 14 is supplied to the AND gate 22, which is supplied with a reset-to-zero signal through a terminal 60 and an inverter. The output signal of the AND gate 22 is supplied to the digital filter 16 and the filter characteristic setting circuit 17. The reset-to-zero signal is supplied to the filter characteristic setting circuit 17. The driver 18 is made up of a sine-wave converter 23, a sinX drive circuit 24 and a cosX drive circuit 25. The output signal of the digital filter is supplied to the sine-wave converter 23, output signals of which are supplied to the sinX drive circuit 24 and the cosX drive circuit 25. The coil 3 is driven by the sinX drive circuit 24, and the coil 4 is driven by the cosX drive circuit 25. The gain of each of the drive circuits 24 and 25 can be adjusted.

The input signal applied to the terminal 19 is supplied to the waveform shaping circuit 20, which generates a pulse signal. The counter 21 counts the pulse signal supplied from the waveform shaping circuit 20, and outputs a count value. The count value passes through the AND gate 22 and is supplied to the digital filter 16 and the filter characteristic setting circuit 17. The digital filter 16 smooths a change of the count value (frequency change) in accordance with a filter characteristic set by the filter characteristic setting circuit 17, and outputs a filter output signal. The filter characteristic setting circuit 17 provides a dull response characteristic when the count value from the AND gate 22 indicates a low-revolution range. On the other hand, when the count value indicates a high-revolution range, the filter characteristic setting circuit 17 provides a sharp response characteristic. Further, during reset-to-zero operation, the filter characteristic setting circuit 17 provides a sharper response characteristic.

The output signal of the digital filter 16 is supplied to the sine-wave converter 23, which generates a sine wave signal, the level of which changes in response to the output signal of the digital filter 16. The sine wave signal is supplied to the sinX drive circuit 24, which amplifies the signal up to a level enough to drive the coil 3. The cosX drive circuit 4 generates the cosine-wave signal of a level enough to drive the coil 4 from the received sine wave signal.

Figure 12:
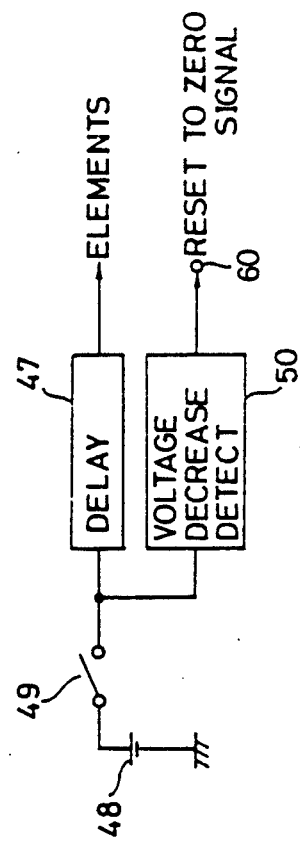
FIG. 12 is a block diagram of a circuit which generates a reset-to-zero signal.

The AND gate 22 prevents the count value from passing therethrough during reset-to-zero operation. The reset-to-zero signal is generated by a circuit shown in FIG. 12. The circuit shown in FIG. 12 is made up of a power source 48, a switch 49 for turning ON/OFF power supply, a delay circuit 47 and a voltage decrease detector 50. The delay circuit 47 charges an internal capacitor (not shown) with the switch 49 ON, and discharges the internal capacitor with the switch 49 OFF. The output of the delay circuit 50 is supplied to structural elements of the circuit shown in FIG. 11. The voltage decrease detector 50 outputs a high-level signal when the switch 49 is turned OFF and thus the voltage at the switch 49 becomes equal to or less than a predetermined voltage. On the other hand, when the voltage at the switch 49 is larger than the predetermined voltage, the voltage decrease detector 50 outputs a low-level signal. While the power supply is OFF, the high-level reset-to-zero signal is supplied to the filter characteristic setting circuit 17, whereby it provides the digital filter 16 with the sharpest filter response characteristic. During this time, the count value from the counter 21 is prevented from passing through the AND gate 22. On the other hand, while the switch 49 is ON, the filter characteristic setting circuit 17 provides a filter response characteristic optimum to the detected frequency (count value).

Figure 13:
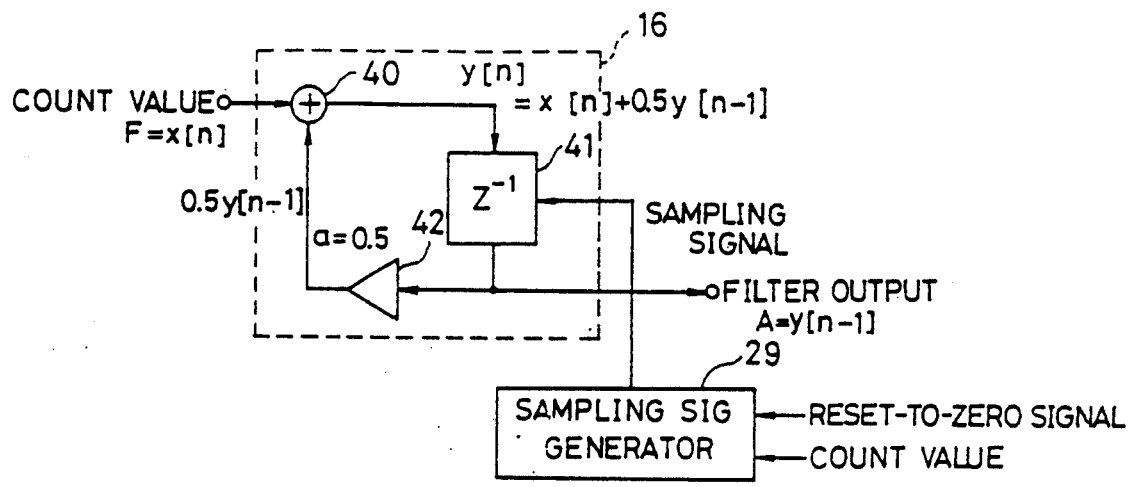
FIG. 13 is a block diagram of a digital filter shown in FIG. 11.

FIG. 13 is a circuit diagram of an example of the structure for the digital filter 16. The illustrated digital filter 16 is made up of an adder 40, a delay element 41 and a multiplier 42. A sampling signal derived from a sampling signal generator 29 is supplied to the delay element 41. The count value from the AND gate 22 is supplied to the adder 40, which is supplied to the output signal of the multiplier 42. The filter output signal is drawn from the output terminal of the delay element 41. The filter response characteristic is based on the frequency of the sampling signal.

Figure 14:
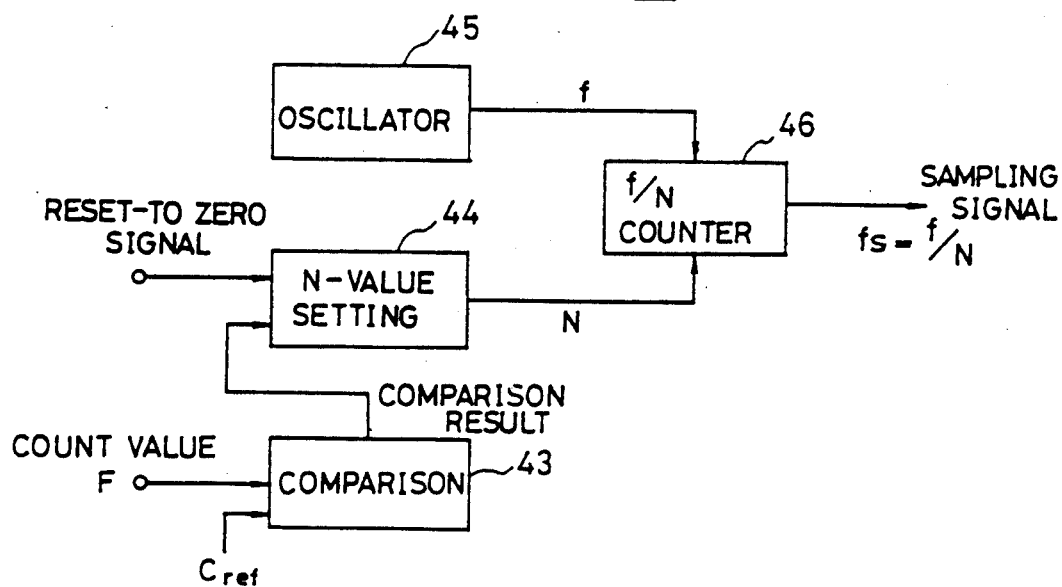
FIG. 14 is a block diagram of a sampling signal generator shown in FIG. 13.
Figure 16:
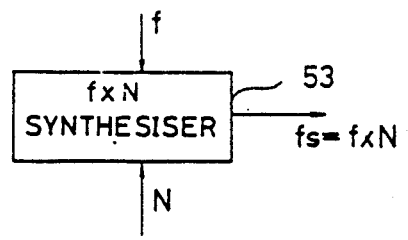
FIG. 16 is a block diagram of an f/N counter shown in FIG. 14.
Figures 20, 21:
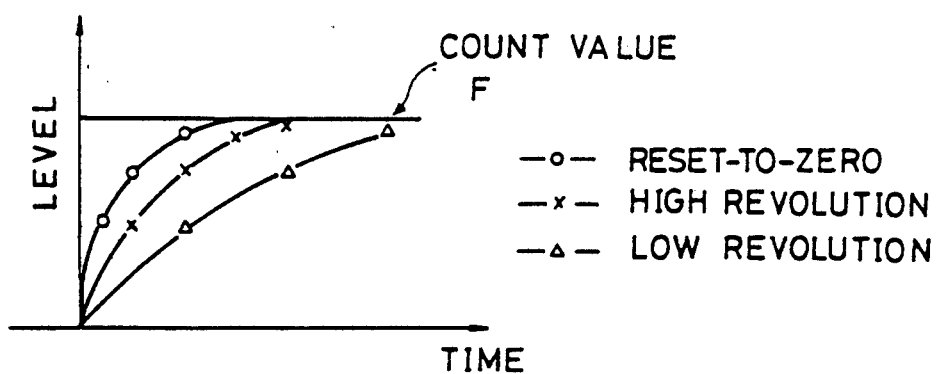
FIG. 20 and 21 are diagrams illustrating a filter response characteristic of the digital filter shown in FIG. 17.

The sampling signal generator 29 may be configured as shown in FIG. 14. The sampling signal generator 29 is made up of a comparator 43, an N-value setting circuit 44, an oscillator 45 and an f/N counter 46. The comparator 43 compares the count value supplied from the counter 21 (FIG. 14) with a reference value $C_{ref}$, and determines whether the current engine revolution is in the high-revolution range or the low-revolution range. The comparison result is supplied to the N-value setting circuit 44, which is supplied with the reset-to-zero signal. Then the N-value setting circuit 44 generates an N-value signal based on the signals supplied thereto. The generated N-value signal is supplied to the f/N counter 46, which is supplied with an oscillation signal of a frequency f from the oscillator 45. The f/N counter 46 divides the frequency f by the N-value and outputs the sampling signal of a frequency fs ($=f/N$). The frequency fs is based on revolution to be measured. The frequency fs is selected as shown in FIG. 20, for example. The filter response characteristic for each of the values of the frequency fs is shown in FIG. 21. As is shown in FIG. 21, a dull filter response characteristic is selected when revolution is in the low-revolution range is dull, and a sharp filter response characteristic is selected when revolution is in the high-revolution range. During reset-to-zero operation, the filter response characteristic is the sharpest so that the reset-to-zero operation can quickly be effected. The f/N counter 46 may be replaced with an fxN synthesizer 53 shown in FIG. 16, which receives the frequency f and the N value.

Figure 15:
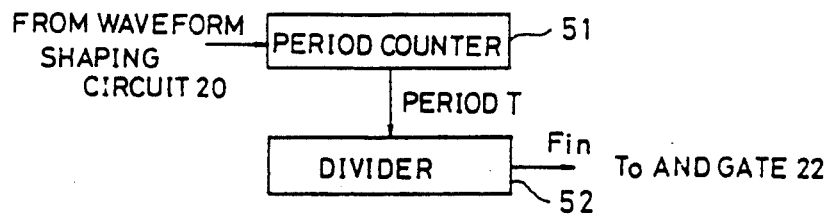
FIG. 15 is a block diagram of a counter shown in FIG. 11.

As shown in FIG. 15, the counter 21 shown in FIG. 11 may be formed by a period counter 51 and a divider 52. The period counter 51 measures a period T of the output signal supplied from the waveform shaping circuit 20. The obtained period T is divided by the divider 52, which generates a signal Fin corresponding to the aforementioned count value.

Figure 17:
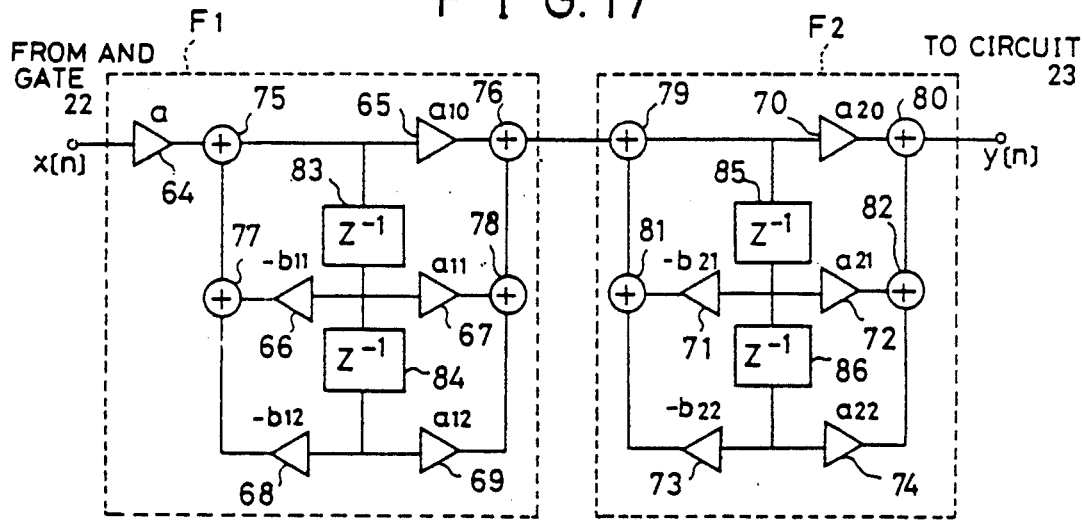
FIG. 17 is a block diagram of the digital filter shown in FIG. 11.
Figures 18, 19:
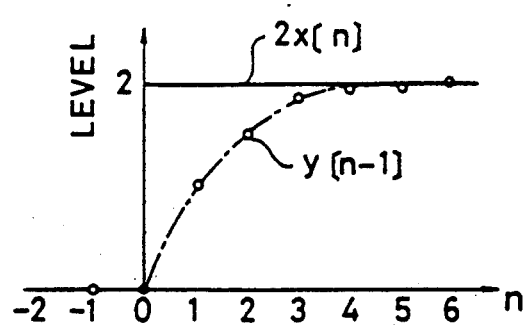
FIGS. 18 and 19 are diagrams illustrating an operation of the digital filter shown in FIG. 17.

The digital filter 16 may be formed by a high-order digital filter as shown in FIG. 17. The illustrated digital filter is a secondary digital filter, which consists of cascaded filters F1 and F2. The filter F1, which receives the output signal of the AND gate 22, is made up of multipliers 64–69, adders 75–78, and delay elements 83 and 84. The filter F2 is made up of multipliers 70–74, adders 79–82, and delay elements 85 and 86. The output signal of the filter F2 is supplied to the sine-wave converter 23 shown in FIG. 11. The filter response characteristic can be adjusted by varying the values of coefficients "a" and "b" in the multipliers 64–74.

The present invention is not limited to the aforementioned embodiments, and variations and modifications may be made without departing from the scope of the present invention.

What is claimed is:

1. A cross coil type instrument comprising:
   a movable permanent magnet;
   a plurality of coils cross-arranged around the movable permanent magnet;
   a needle fastened to said movable permanent magnet through a shaft projecting from said movable permanent magnet and penetrating said coils;
   a reset-to-zero permanent magnet arranged in the vicinity of said movable permanent magnet;
   a stopper positioned so as to make contact with said needle at a reference indication position when said movable permanent magnet is driven only by said reset-to-zero permanent magnet; and
   drive means for receiving an input signal related to a quantity to be measured and generating drive signals to be supplied to the respective coils based on said input signal so that a composite magnetic field formed by said coils presents a first error in deflection angle of said movable permanent magnet, and an error obtained by adding said first error in deflection angle and a second error in deflection angle due to said reset-to-zero permanent magnet changes linearly as a function of an electrical angle of said drive signals.

2. A cross coil type instrument as claimed in claim 1, wherein said drive means generates said drive signals having different amplitudes.

3. A cross coil type instrument as claimed in claim 2, wherein said coils have numbers of turns which are equal to each other.

4. A cross coil type instrument as claimed in claim 1, wherein said coils have numbers of turns which are different from each other.

5. A cross coil type instrument as claimed in claim 4, wherein said drive means generates said drive signals of the same amplitude.

6. A cross coil type instrument as claimed in claim 1, wherein said drive means includes means for generating said drive signals of the same amplitude, and resistor means provided for some of said coils for decreasing said drive signals to be supplied to said some of said coils.

7. A cross coil type instrument as claimed in claim 6, wherein said coils have numbers of turns which are identical to each other.

8. A cross coil type instrument as claimed in claim 1, wherein said stopper is positioned so that when said needle makes contact with said stopper, said movable permanent magnet precedes, by a predetermined deflection angle, an original reset-to-zero position of said movable permanent magnet where poles of said movable permanent magnets and said reset-to-zero permanent magnets are arranged into a line.

9. A cross coil type instrument as claimed in claim 8, wherein said predetermined deflection angle is selected between 35 degrees and 55 degrees.

10. A cross coil type instrument as claimed in claim 8, wherein said stopper is located at an angle with respect to said original reset-to-zero position, and said angle is larger than said predetermined deflection angle.

11. A cross coil type instrument as claimed in claim 8, further comprising a scale plate arranged between said movable permanent coil and said needle, wherein said scale plate has instruction scales arranged thereon at equal intervals.

12. A cross coil type instrument as claimed in claim 1, wherein said coils are a pair of coils cross-arranged around said movable permanent magnet.

13. A cross coil type instrument as claimed in claim 1, wherein said drive means comprises:
   detection means for detecting the frequency of said input signal and generating a digital signal based on said detected frequency;
   digital filter means, coupled to said detection means, for filtering said digital signal in accordance with a filter response characteristic to be set based on said detected frequency and generating a filter output signal; and
   means, coupled to said digital filter means, for generating said drive signals from said digital filter output signal.

* * * * *